United States Patent
Dias et al.

(10) Patent No.: US 9,693,472 B2
(45) Date of Patent: Jun. 27, 2017

(54) CABLE MANAGEMENT SYSTEMS FOR ENCLOSURES

(71) Applicant: Emerson Network Power, Energy Systems, North America, Inc., Warrenville, IL (US)

(72) Inventors: Kenneth Dias, St. Cruz (IN); Rakesh Mahaling Mali, Karad (IN)

(73) Assignee: VERTIV ENERGY SYSTEMS, INC., Lombard, IL (US)

( * ) Notice: Subject to any disclaimer, the term of this patent is extended or adjusted under 35 U.S.C. 154(b) by 62 days.

(21) Appl. No.: 14/735,686

(22) Filed: Jun. 10, 2015

(65) Prior Publication Data

US 2015/0357805 A1 Dec. 10, 2015

(30) Foreign Application Priority Data

Jun. 10, 2014 (IN) .......................... 1897/MUM/2014

(51) Int. Cl.
*H02G 3/08* (2006.01)
*H05K 5/02* (2006.01)
*H02G 3/32* (2006.01)

(52) U.S. Cl.
CPC ............. *H05K 5/0247* (2013.01); *H02G 3/32* (2013.01)

(58) Field of Classification Search
CPC  H02G 3/32; H02G 3/08; H02G 3/085; H02G 3/30; H02G 3/36; H05K 5/02; H05K 5/00; H05K 5/0247; H05K 5/0217

USPC ....... 174/68.1, 68.3, 135, 72 A, 50, 382, 64, 174/40 CC; 248/68.1, 49; 211/26; 361/826, 600, 724; 385/134, 135
See application file for complete search history.

(56) References Cited

U.S. PATENT DOCUMENTS

| | | | | |
|---|---|---|---|---|
| 6,711,031 B1* | 3/2004 | Jelinger | ................... | H02G 3/32 174/72 A |
| 6,913,229 B2* | 7/2005 | Jelinger | ................ | H05K 13/06 248/68.1 |
| 7,637,771 B2* | 12/2009 | Laursen | ................ | H04Q 1/062 211/26 |
| 7,770,852 B2* | 8/2010 | Caveney | ................. | H02G 3/32 248/68.1 |
| 7,861,981 B2* | 1/2011 | Olver | ....................... | H02G 3/32 248/68.1 |
| 8,552,294 B2* | 10/2013 | Li | ............................ | H02G 3/26 174/135 |
| 8,593,829 B2* | 11/2013 | Li | ........................ | H02G 3/0406 174/97 |

(Continued)

*Primary Examiner* — Angel R Estrada
(74) *Attorney, Agent, or Firm* — Harness, Dickey & Pierce, P.L.C.

(57) ABSTRACT

An enclosure for housing electronic equipment includes one or more panels, at least one stud extending from a panel of the one or more panels, and at least one peg removably coupled to the panel via the at least one stud. The at least one stud includes a thread. The at least one peg includes a body portion defining an opening for receiving the at least one stud and a through hole extending therethrough for receiving a cable fastener to secure one or more cables in the enclosure. The body portion includes a thread adjacent the opening corresponding to the thread of the at least one stud for removably coupling the at least one peg to the panel via the at least one stud. Other example enclosures are also disclosed.

19 Claims, 5 Drawing Sheets

(56) References Cited

U.S. PATENT DOCUMENTS 8,598,462 B2 * 12/2013 Li .................. H05K 7/1491
                                                    174/135
8,624,133 B2 *  1/2014 Pedoeem ............ H05K 9/0018
                                                    174/382

* cited by examiner

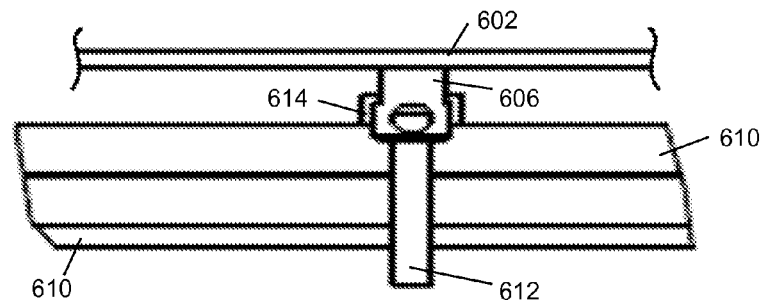
FIG. 6C
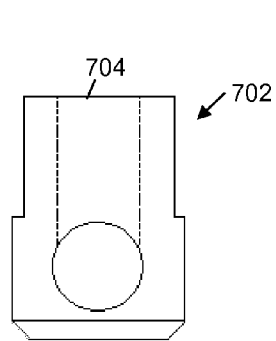
FIG. 7A
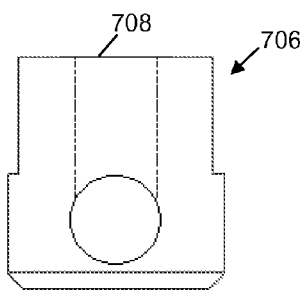
FIG. 7B
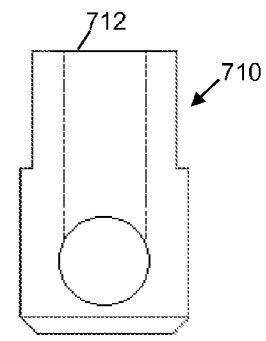
FIG. 7C
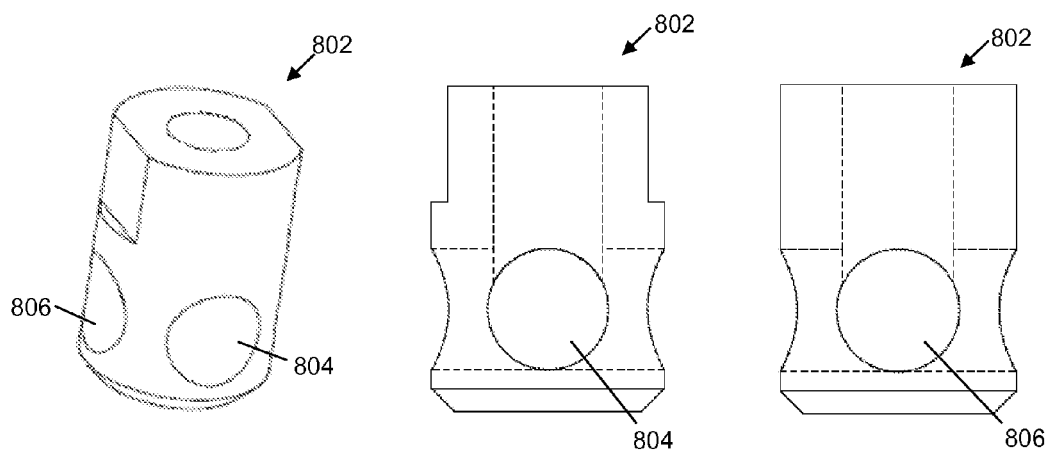
FIG. 8A
FIG. 8B
FIG. 8C

US 9,693,472 B2

CABLE MANAGEMENT SYSTEMS FOR ENCLOSURES

CROSS-REFERENCE TO RELATED APPLICATION

This application claims the benefit of Indian Application No. 1897/MUM/2014 filed Jun. 10, 2014. The entire disclosure of the above application is incorporated herein by reference.

FIELD

The present disclosure relates to cable management systems for enclosures.

BACKGROUND

This section provides background information related to the present disclosure which is not necessarily prior art.

An enclosure may house a variety of cables for coupling various components in the enclosure. The cables may have different diameters, lengths, and configurations. Some enclosures include panels having various lances for receiving a fastener such as a P-clamp to secure and manage the cables. The panels may be attached to walls within the enclosure. Additionally, some enclosures may include various lances integrated into exterior walls of the enclosure. In such cases, fluids (e.g., air, water, etc.) may enter the enclosures via openings in the lances.

FIG. 1A illustrates a conventional enclosure 10 including a panel 12 coupled to a top wall of the enclosure 10 and having various lances 14. FIG. 1B illustrates a conventional enclosure 20 including a panel 22 coupled to a side wall of the enclosure 20 and having various lances 24. FIG. 1C illustrates a conventional enclosure 30 including various lances 34 integrated into an exterior wall 32 of the enclosure 30.

SUMMARY

This section provides a general summary of the disclosure, and is not a comprehensive disclosure of its full scope or all of its features.

According to one aspect of the present disclosure, an enclosure for housing electronic equipment includes one or more panels, at least one stud extending from a panel of the one or more panels, and at least one peg removably coupled to the panel via the at least one stud. The at least one stud includes a thread. The at least one peg includes a body portion defining an opening for receiving the at least one stud and a through hole extending therethrough for receiving a cable fastener to secure one or more cables in the enclosure. The body portion includes a thread adjacent the opening corresponding to the thread of the at least one stud for removably coupling the at least one peg to the panel via the at least one stud.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1A-C are isometric views of conventional enclosures including various lances.

FIG. 6C is a side view of the panel, the peg, and the cable fastener of FIG. 6A.

FIGS. 7A-7C are cross-sectional side views of pegs having different sizes according to another example embodiment.

FIG. 8A is an isometric view of a peg having two through holes according to yet another example embodiment.

FIG. 8B is a cross-sectional front view of the peg of FIG. 8A.

FIG. 8C is a cross-sectional side view of the peg of FIG. 8A.

Corresponding reference numerals indicate corresponding parts or features throughout the several views of the drawings.

DETAILED DESCRIPTION

Figure 1A:
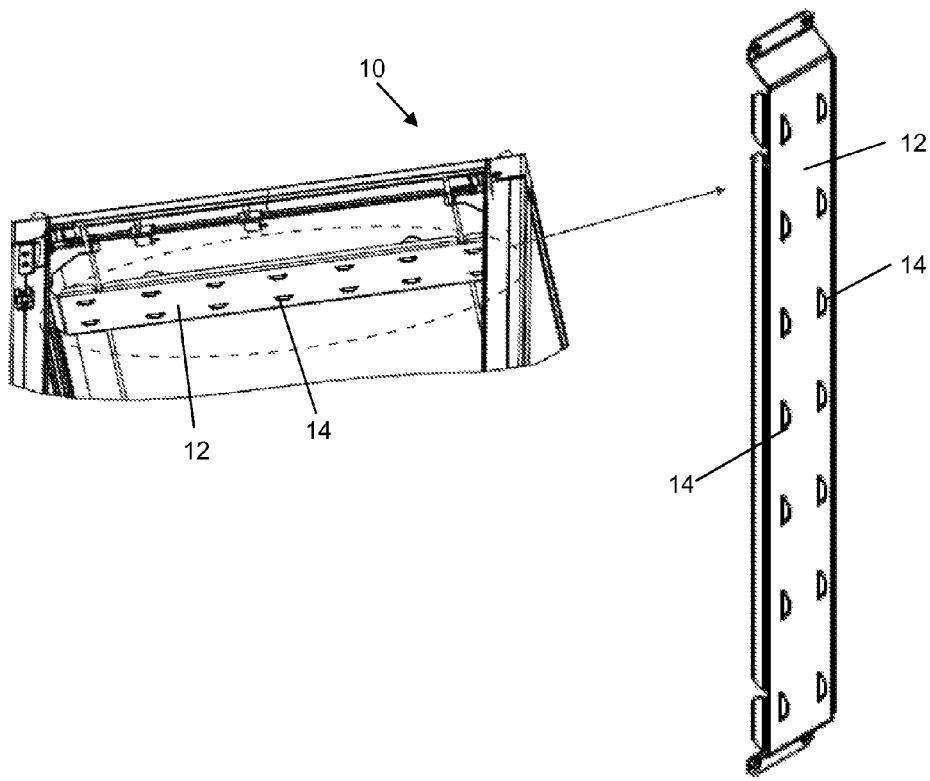
Figure 1B:
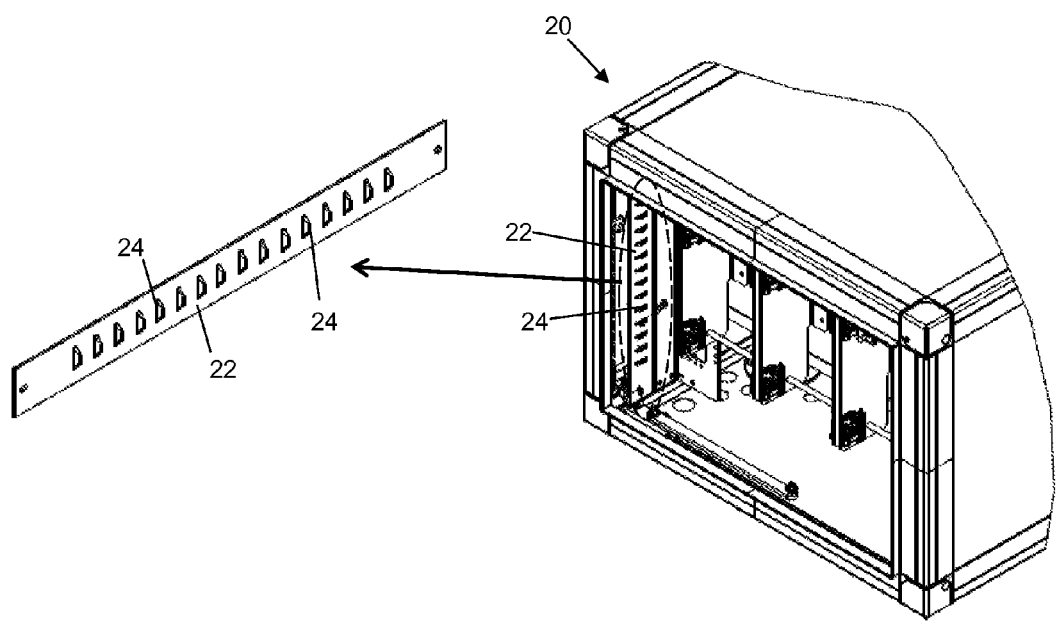
Figure 1C:
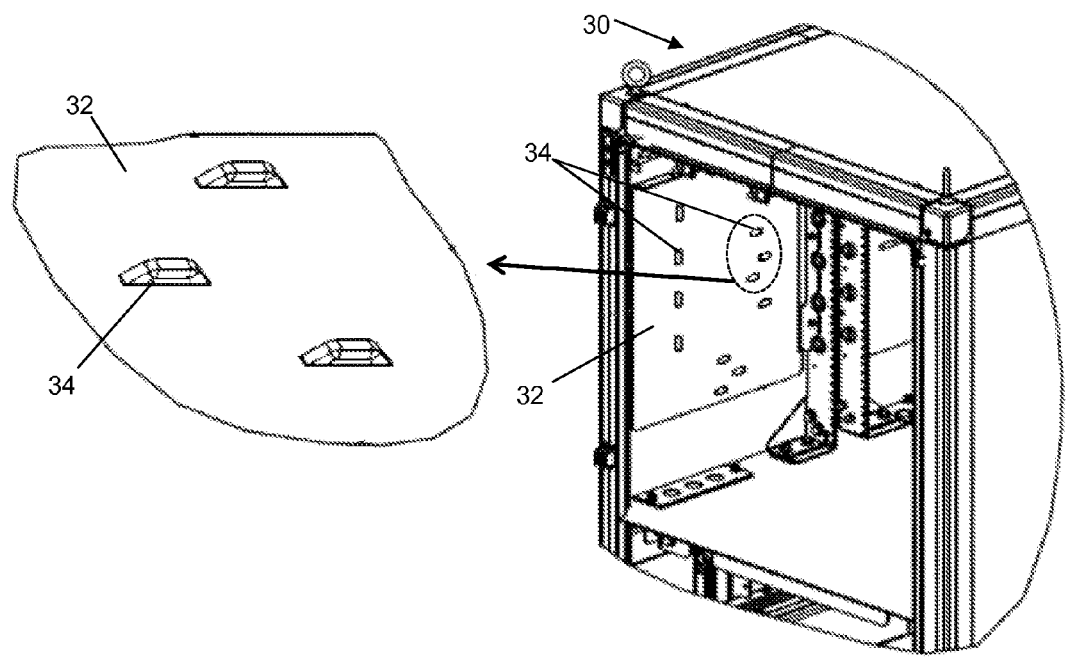

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
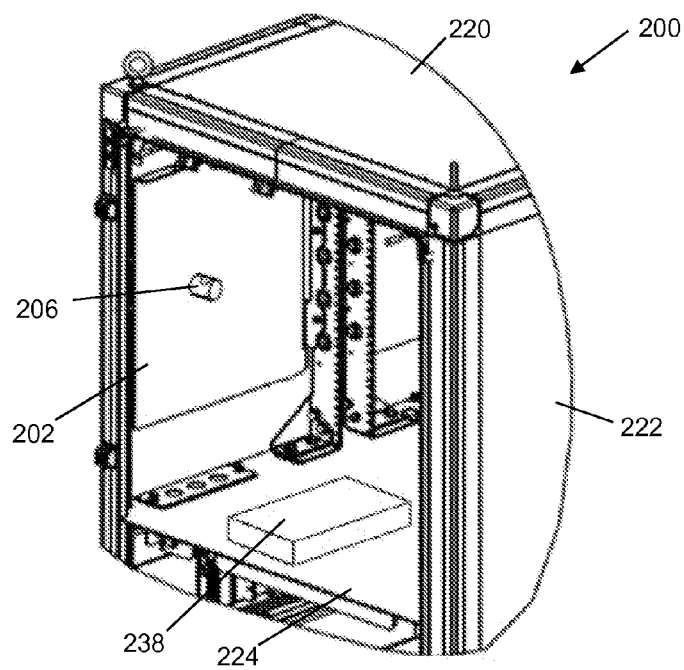
FIG. 2 is an isometric view of a portion of an enclosure including a panel and a peg extending from the panel and having a through hole for securing one or more cables according to one example embodiment of the present disclosure.
Figure 3:
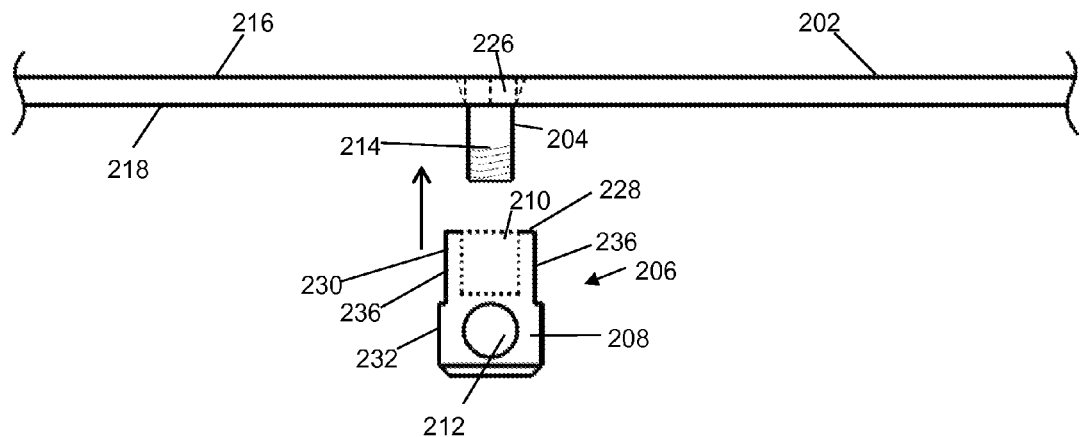
FIG. 3 is a cross-sectional side view of the panel and the peg of FIG. 2.

A portion of an enclosure for housing electronics equipment according to one example embodiment of the present disclosure is illustrated in FIGS. 2 and 3, and indicated generally by reference number 200. As shown in FIGS. 2 and 3, the enclosure 200 includes a panel 202, a stud 204 (see FIG. 3) extending from the panel 202, and a peg 206 removably coupled to the panel 202 via the stud 204. The peg 206 includes a body portion 208 defining an opening 210 for receiving the stud 204 and a through hole 212 extending therethrough for receiving a cable fastener to secure one or more cables in the enclosure 200. The stud 204 includes a thread 214 and the body portion 208 includes a thread (not shown in FIGS. 2 and 3) adjacent the opening 210 corresponding to the thread 214 of the stud 204 for removably coupling the peg 206 to the panel 202 via the stud 204.

As shown in FIGS. 2 and 3, the panel 202 may be an exterior panel of the enclosure 200. For example, the panel 202 includes opposing sides 216, 218. The side 216 is a portion of the exterior surface of the enclosure 200 and thus may be exposed to ambient. The side 218 defines (at least partially) an interior of the enclosure 200. The stud 204 extends from the side 218 and is flush with the side 216 (as further explained below). Thus, the peg 206 may be removably coupled to an exterior panel (via the stud 204).

Alternatively and/or additionally, one or more studs (e.g., the stud 204, etc.) may extend from another panel of the enclosure 200. For example, one or more studs may extend from one or more other exterior panels (e.g., panels 220, 222 of the enclosure 200), one or more interior panels (e.g., a panel 224, another panel such as a bracket, a rail, etc. coupled to the panels 202, 220, 222, 224 (not shown), a panel of an interior enclosure, etc.) of the enclosure 200, etc. Additionally, although the panel 202 is a vertically extending panel in the enclosure 200 of FIG. 2, it should be apparent that one or more studs may extend from a horizontally extending panel (e.g., the panel 224, etc.) if desired.

Figure 5A:
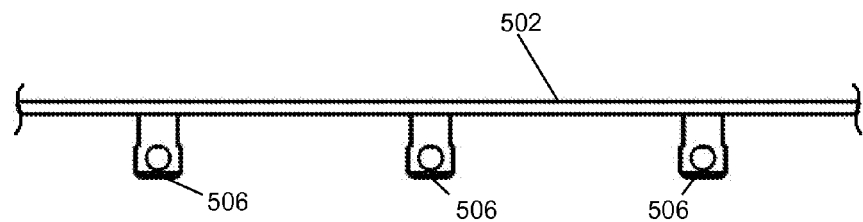
FIG. 5A is a side view of a panel and three pegs extending from the panel according to another example embodiment.
Figure 5B:
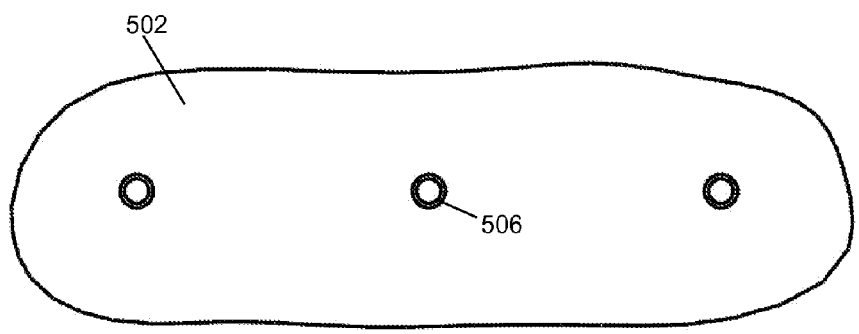
FIG. 5B is a bottom view of the panel and the pegs of FIG. 5A.

Additionally, and as shown in FIG. 2, the enclosure 200 includes one peg 206 coupled to the panel 202. In other embodiments, more than one peg may extend from the panel 202. As such, the enclosure 200 may include a panel including two studs and two pegs, one panel including four studs and two pegs and another panel including eight studs and eight pegs, etc. For example, FIGS. 5A and 5B illustrate a panel 502 and three pegs 506 extending from the panel 502. The panel 502 may be an exterior panel (e.g., similar to the panel 202 of FIGS. 2 and 3 and/or another suitable exterior panel), an interior panel (e.g., similar to the panel 224 of FIGS. 2 and 3 and/or another suitable interior panel, etc.). As shown in FIG. 5A, each of the pegs 506 is substantially similar to the peg 206 of FIGS. 2 and 3. Alternatively, one or more of the pegs 506 may include additional optional features not shown in FIGS. 2 and 3, and/or not include one or more optional features shown in FIGS. 2 and 3. For example, one or more of the pegs 506 may not include recesses and/or a linear through hole as further explained below.

In the example embodiment of FIGS. 2 and 3, the stud 204 may be a self-clinching stud. For example, the stud 204 may be permanently attached to the panel 202 by altering dimensions of the stud 204 and/or the panel 202 (e.g., adjacent an area of the stud). In some examples, the stud 204 (when attached) may displace a portion of the panel 202 adjacent the stud and/or fill an opening in the panel 202. For example, the stud 204 may be attached to the panel 202 by the process of stamping (sometimes referred to as pressing, etc.) and/or another suitable process. Alternatively, one or more studs (e.g., the stud 204, etc.) may be integrally formed with the panel 202 when the panel is produced.

As shown in FIG. 3, the stud 204 is flush with the side 216 of the panel 202. For example, if the stud 204 is stamped into an opening of the panel 204 as explained above, a portion 226 of the stud 204 may substantially fill the opening (and/or displace portion of the panel 202) such that the side 216 (e.g., the exterior facing surface) of the panel 202 and the portion 226 of the stud 204 form a substantially continuous plane. As such, the portion 226 of the stud 204 may be in the same plane as the side 216 of the panel 202. In some embodiments, the side 216 and the portion 226 of the stud 204 may form a substantially continuous surface. In such examples, fluids (e.g. air, liquids, etc.) may be prevented from entering the enclosure 200 via the stud/panel connection area, and/or the exterior surface of the enclosure 200 may have a low profile without undesired protrusions extending from the panel side 216.

As explained above, the peg 206 includes the body portion 208 defining the opening 210. In particular, the peg 206 includes a proximal end 230 adjacent the panel 202 (when the peg 206 is coupled to the panel 202), a distal end 232 opposing the proximal end 230, and a surface 228 adjacent the proximal end 230. As shown in FIG. 3, the opening 210 (e.g., a bore, etc.) extends from the surface 228 to an interior portion of the peg 206 in the normal direction (relative to the surface 228). Alternatively, the peg 206 may include an opening that extends from the surface 228 to the interior portion of the peg 206 at another suitable angle. Additionally, the peg 206 may include an opening extending from another surface of the peg 206.

The opening 210 may extend any suitable distance into the peg 206. For example, a length of the opening 210 may be substantially equal to the length of the stud 204. In such cases, the peg 206 may be substantially flush with the side 218 of the panel 202 when the peg 206 is coupled to the panel 202 (via the stud 204). Alternatively, the opening 210 may have a length smaller or larger than the length of the stud 204.

Figure 4:
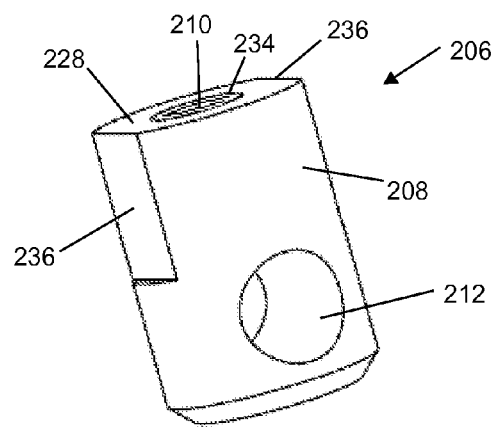
FIG. 4 is an isometric view of the peg of FIG. 2.

As explained above, the peg 206 includes a thread adjacent the opening 210 corresponding to the thread 214 of the stud 204. For example, FIG. 4 illustrates the peg 206 including a thread 234 adjacent the opening 210. Thus, the internally configured thread 234 of the peg 206 aligns with the externally configured thread 214 of the stud 204 for screwing the peg 206 to the panel 202 (via the stud 204) and unscrewing the peg 206 from the panel 202. The stud thread 214 and/or the peg thread 234 may be any suitable length. For example, the threads 214, 234 may have the same length or different lengths. As such, the thread 214 may extend substantially the length of the stud 204, about half the length of the stud 204 (as shown in FIG. 3), the thread 234 may extend substantially the length of the opening 210, about half the length of the opening 210, etc.

As shown in the example embodiment of FIGS. 2-4, the body portion 208 of the peg 206 may include one or more recesses 236 for assisting in removably coupling the peg 206 to the panel 202. For example, body portion 208 may include a substantially flat portion extending across one side of the peg to create a recess 236. This flat portion may allow a user to gain leverage to rotate the peg 206 on and/or off the stud 204 as explained above. As such, the peg 206 may be coupled to the panel 202 without requiring tools (e.g., hand tools, power tools, etc.).

The body portion 208 includes two recesses 236 on opposing sides of the peg 206. Alternatively, the body portion 208 may include more or less recesses if desired. For example, the body portion 208 may include four recesses. In such examples, the proximal end 230 of the peg 206 may be substantially rectangular. In other embodiments, the body portion 208 may not include a recess or the like.

As shown in FIGS. 2-4, the peg 206 defines a through hole 212 extending from one side of the peg 206 to an opposing side of the peg 206. In some embodiments, the opposing sides may be directly opposing sides (e.g., as shown in FIGS. 3 and 4). As such, the through hole 212 may be a substantially linear through hole, and extend through a middle portion of the peg 206.

Alternatively, the peg 206 may include a through hole extending between adjacent sides of the peg. For example, a through hole may extend between a bottom side and a side surface of the peg 206, between two adjacent side surfaces, etc. In such examples, a through hole may include an angle (e.g., a substantially forty-five degree angle, a substantially ninety degree angle, etc.) between adjacent sides. In other examples, the through hole may extend linearly from adjacent sides. In such cases, the through hole may not extend through a middle portion of the peg.

Additionally, and as shown in FIGS. 3 and 4, the through hole 212 (e.g., a central axis of the through hole 212) may extend substantially parallel to the panel 202 and/or the surface 228 of the peg 206. As such, the central axis of the through hole 212 extends substantially perpendicular to a central axis of the opening 210. Alternatively, the through hole 212 may not extend substantially parallel to the panel 202 and/or the surface 228 of the peg 206. For example, the through hole 212 may be angled (e.g., relative to the panel 202 and/or the surface 228 of the peg 206) from one side to another side of the peg. As such, the peg 206 may include a through hole extending parallel to the panel 202 and/or the surface 228 and having a ninety degree angle, a linear through hole not extending parallel to the panel 202 and/or the surface 228, etc.

As mentioned above, the through hole 212 receives a cable fastener to secure one or more cables in the enclosure 200. As such, the stud and the peg may be a portion of a cable management system. For example, FIGS. 6A-C illustrate a portion of a panel 602 of an enclosure, a peg 606 coupled to the panel 602 (as explained above), and a cable fastener 608 coupled to the peg 606 and configured to secure various cables 610 in the enclosure.

The panel 602 and/or the peg 606 may be substantially similar to the panel 202 and/or the peg 206 explained above. For example, the peg 506 may include the same optional features of the peg 206 shown in FIGS. 2-4, additional optional features not shown in FIGS. 2-4, and/or not include one or more optional features shown in FIGS. 2-4. For example, the peg 506 may not include recesses, a linear through hole as explained above, etc. and/or may include four recesses, a curved through hole as explained above, etc.

Figure 6A:
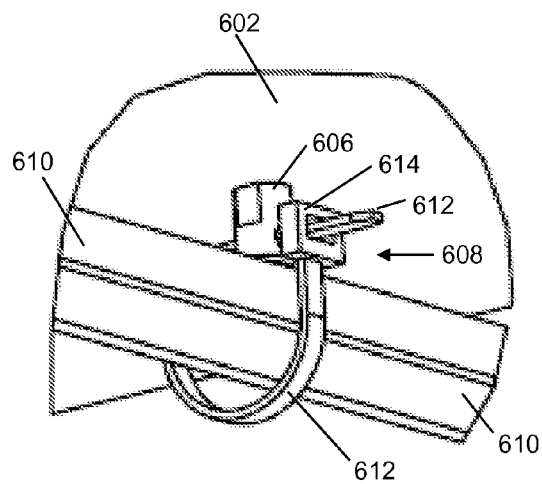
FIG. 6A is an isometric view of a panel, a peg having a through hole, and a cable fastener coupled to the peg for securing one or more cables according to yet another example embodiment.
Figure 6B:
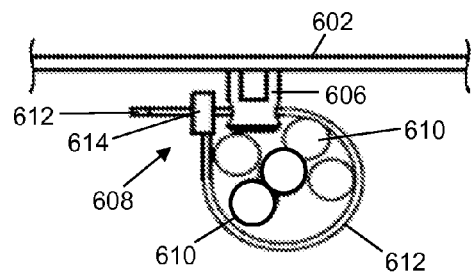
FIG. 6B is a front view of the panel, the peg, and the cable fastener of FIG. 6A.

As shown in FIGS. 6A-C, the cable fastener 608 includes a flexible cord element 612 having two opposing ends and a locking element 614 positioned at one end of the cord element 612. In the example embodiments of FIGS. 6A-C, at least a portion of the flexible cord element 612 may pass through an opening of the locking element 614 which may engage the flexible cord element 612 to prohibit it from releasing from the opening of the locking element.

A user can adjust the cable fastener 608 by passing more or less portions of the flexible cord element 612 through the locking element to decrease or increase an enclosed area defined by the cord element. Thus, the cable fastener 608 may be considered an adjustable cable tie. As such, the cables 610 may be loose and therefore movable within the cable fastener 608 as shown in FIGS. 6A-C, pulled tight to each other and therefore substantially not movable within the cable fastener 608, etc.

Alternatively, any other suitable fastener may be employed to secure one or more cables in the enclosure. For example, the fastener may include a flexible cable with no locking element, a rigid fastener, etc. for gripping and/or securing the one or more cables in an enclosure The pegs and/or the studs disclosed herein may be any suitable shape and/or size. As such, one or more pegs and/or one or more studs may be sized and/or shaped to cater to different needs including, for example, holding cables of different configurations, sizes, weight, etc. For example, if the peg is required to hold heavier cables or a large number of cables, the peg may be sized larger and/or shaped according. In some examples, the pegs may have a substantially cylindrical shape (e.g., as shown in FIGS. 2-8), a substantially rectangular shape, a substantially triangular shape, etc.

For example, FIGS. 7A-7C illustrate pegs 702, 706, 710 each having a different size. As shown, the peg 706 of FIG. 7B has a greater width than the pegs 702, 710 of FIGS. 7A and 7B. Additionally, the peg 710 of FIG. 7C is taller (e.g., has a greater height) than the pegs 702, 706 of FIGS. 7A and 7B. As shown in FIGS. 7A-7C, the pegs 702, 706, 710 may include openings 704, 708, 712, respectively, having similar sized diameters. As such, the pegs may be replaced without modifying a stud, adding new studs, etc.

In some examples, the pegs disclosed herein may include more than one through hole. For example, FIGS. 8A-C illustrate a peg 802 substantially similar to the peg 206 of FIGS. 2-4, but including two through holes 804, 806 extending therethrough. One or both through holes 804, 806 may receive a cable fastener (as explained above) to secure one or more cables in an enclosure.

As shown in FIGS. 8A-C, the through hole 804 extends perpendicular to the through hole 806. In other examples, the through hole 804 may not extend perpendicular to the through hole 806. For example, the peg 802 may include two or more through holes both extending from one side to another side of the peg 802.

Additionally, the through hole 804 intersects the through hole 806. As such, a cable fastener may enter an opening for the through hole 804 and exit an opening for the through hole 806. Thus, the peg 802 provides different orientations for conveniently receiving a cable fastener. Alternatively, the peg 802 may include two or more nonintersecting through holes. In such examples, the through holes may extend in different planes to prevent intersecting.

The panels, studs, and/or the pegs disclosed herein may be any suitable material. For example, the panels, the studs, and/or the pegs may be sheet metal made from aluminum, tin, steel, etc. depending on various requirements (e.g., strength, etc.) of the components.

The enclosures disclosed herein may be used for various applications. For example, the enclosures may be telecommunications enclosures, power transfer switch enclosures, generator enclosures, and/or any other suitable enclosure for housing electronic equipment (e.g., electronic equipment 238 of FIG. 2) such as batteries, telecommunications equipment, rectifiers, converters, inverters, etc.

By employing one or more features disclosed herein, a cable management system formed of the panels, the pegs and/or the studs may firmly hold, organize, arrange, etc. various cables in a systematic manner inside an enclosure for ensuring efficient and systematic cable management to prevent tangling of cables, etc. Additionally, the pegs and the studs provide a cable management system that is simple in construction, easy to replace and/or modify (e.g., by moving, replacing, etc. pegs) for catering to different needs, cable sizes, etc., and reliable to prevent unintended disengagement of cables.

In addition, by employing the pegs and studs, cables and/or cable fasteners may be less susceptible to damage caused by, for example, sharp edges commonly associated with lances. As such, load bearing capabilities of cable fasteners may be improved. Further, the studs (when attached) may prevent fluid from entering the enclosure (as explained above) thereby meeting Generic Requirements (GR) standards for telecommunications cabinets. As such, the studs and the pegs may be positioned on various surfaces (e.g., exterior walls, interior walls, interior brackets, etc.) of an enclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An enclosure for housing electronic equipment, the enclosure comprising:
one or more panels,
at least one stud extending from a panel of the one or more panels, the at least one stud including a thread, and
at least one peg removably coupled to the panel via the at least one stud, the at least one peg including a body portion defining an opening for receiving the at least one stud and a through hole extending therethrough for receiving a cable fastener to secure one or more cables in the enclosure, the body portion including a thread adjacent the opening corresponding to the thread of the at least one stud for removably coupling the at least one peg to the panel via the at least one stud.

2. The enclosure of claim 1 further comprising a cable fastener coupled to the at least one peg and configured to secure the one or more cables in the enclosure.

3. The enclosure of claim 2 wherein the cable fastener includes an adjustable cable tie.

4. The enclosure of claim 1 wherein the panel includes a first side and a second side opposing the first side, wherein the at least one stud extends from the first side of the panel, and wherein the at least one stud is flush with the second side of the panel.

5. The enclosure of claim 4 wherein the panel is an exterior panel of the enclosure.

6. The enclosure of claim 1 wherein the body portion of the at least one peg includes one or more recesses for assisting in removably coupling the at least one peg to the panel.

7. The enclosure of claim 1 wherein the at least one peg includes a substantially cylindrical peg.

8. The enclosure of claim 1 wherein the through hole is a substantially linear through hole.

9. The enclosure of claim 1 wherein the at least one stud includes at least two studs each extending from the panel and wherein the at least one peg includes at least two pegs removably coupled to the panel via the at least two studs.

10. The enclosure of claim 1 wherein the at least one stud includes a self-clinching stud.

11. The enclosure of claim 1 wherein the through hole is a first through hole, wherein the body portion defines a second through hole different than the first through hole extending therethrough.

12. The enclosure of claim 11 wherein the first through hole intersects and the second through hole.

13. The enclosure of claim 12 wherein the first through hole extends perpendicular to the second through hole.

14. The enclosure of claim 12 wherein the at least one stud includes a self-clinching stud.

15. The enclosure of claim 12 wherein at least one of the first through hole and the second through hole is a substantially linear through hole.

16. The enclosure of claim 11 wherein the panel includes a first side and a second side opposing the first side, wherein the at least one stud extends from the first side of the panel, and wherein the at least one stud is flush with the second side of the panel.

17. The enclosure of claim 11 wherein the body portion of the at least one peg includes one or more recesses for assisting in removably coupling the at least one peg to the panel.

18. The enclosure of claim 11 wherein the first through hole extends perpendicular to the second through hole.

19. The enclosure of claim 1 wherein the through hole defined by the body portion includes a first opening, a second opening, and a passage extending between the first opening and the second opening, and wherein at least a portion of the passage extends substantially parallel to said panel of the one or more panels.

\* \* \* \* \*